US012588436B2

(12) United States Patent
Arellano et al.

(10) Patent No.: US 12,588,436 B2
(45) Date of Patent: Mar. 24, 2026

(54) AREA SELECTIVE DEPOSITION OF HARDMASKS FOR VACUUM GAP FORMATION

(71) Applicant: International Business Machines Corporation, San Jose, CA (US)

(72) Inventors: Noel Arellano, Gilroy, CA (US); Krystelle Lionti, San Jose, CA (US); Rudy J Wojtecki, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 18/383,976

(22) Filed: Oct. 26, 2023

(65) Prior Publication Data

US 2025/0140550 A1     May 1, 2025

(51) Int. Cl.
*H01L 21/02* (2006.01)
*C23C 16/40* (2006.01)
*C23C 16/455* (2006.01)
*H10P 14/60* (2026.01)
*H10P 14/692* (2026.01)

(52) U.S. Cl.
CPC ........ *H10P 14/6339* (2026.01); *C23C 16/401* (2013.01); *C23C 16/45536* (2013.01); *H10P 14/6922* (2026.01)

(58) Field of Classification Search
None
See application file for complete search history.

(56) References Cited

U.S. PATENT DOCUMENTS 6,630,404 B1   10/2003  Babcock
7,939,446 B1    5/2011  Clevenger et al.

8,652,962 B2    2/2014  Singh et al.
9,406,614 B2    8/2016  Huang et al.
10,892,223 B2   1/2021  Schenker et al.
11,094,535 B2   8/2021  Tois et al.
11,189,560 B2  11/2021  Lee et al.
11,322,395 B2   5/2022  Huang et al.
2010/0319971 A1*  12/2010  Lin ..................... H01L 21/7682
                                                        174/258

(Continued)

FOREIGN PATENT DOCUMENTS

CN         1684229 A    10/2005
CN       109103168 A    12/2018

OTHER PUBLICATIONS

Anonymous, Structure and method of oblique air gap design, IP.com No. IPCOM000203487D, pp. 1-7 (2011) (ip.com/IPCOM/000203487).

(Continued)

*Primary Examiner* — Asok K Sarkar
(74) *Attorney, Agent, or Firm* — Kelsey M. Skodje

(57)            ABSTRACT

A method for vacuum gap formation on a dielectric substrate uses area selective deposition (ASD), such as atomic layer deposition (ALD) or chemical vapor deposition (CVD), of a hardmask material on a substrate patterned with a self-assembled monolayer (SAM) and metal features. Due to the presence of the SAM, the hardmask material reaches, but does not touch the metal features leaving areas that will form gaps on the resultant hardmask when the SAM is removed from the substrate. Etching of the dielectric substrate forms trenches in the areas of the gaps. When a non-conformal coating is deposited on the dielectric substrate, vacuum gaps form in the trenches as the non-conformal coating enters into the trenches, but closes off at the surface of the substrate prior to the complete filling of the trench.

25 Claims, 5 Drawing Sheets

(56) References Cited

U.S. PATENT DOCUMENTS

| | | | | |
|---|---|---|---|---|
| 2011/0221062 A1* | 9/2011 | Clevenger | ......... | H01L 21/02126 |
| | | | | 257/E21.585 |
| 2011/0260326 A1* | 10/2011 | Clevenger | ......... | H01L 21/76829 |
| | | | | 257/770 |
| 2013/0334700 A1 | 12/2013 | Singh et al. | | |
| 2014/0252620 A1 | 9/2014 | Huang et al. | | |
| 2015/0056813 A1 | 2/2015 | Huang et al. | | |
| 2018/0175063 A1 | 6/2018 | Lee et al. | | |
| 2018/0233350 A1 | 8/2018 | Tois et al. | | |
| 2020/0066629 A1 | 2/2020 | Schenker et al. | | |
| 2021/0066187 A1 | 3/2021 | Lee et al. | | |
| 2021/0193505 A1 | 6/2021 | Huang et al. | | |
| 2021/0305087 A1 | 9/2021 | Parikh | | |
| 2022/0139823 A1 | 5/2022 | Lin et al. | | |
| 2023/0093604 A1* | 3/2023 | Ok | ....................... | H10N 70/231 |
| | | | | 257/4 |
| 2024/0179892 A1* | 5/2024 | Jung | ....................... | H10B 12/50 |

OTHER PUBLICATIONS

Anonymous, Advanced Interconnect Structure and Fabrication, IP.com No. IPCOM000247705D, pp. 1-5 (2011) (ip.com/IPCOM/000247705).

Bunker et al., The Impact of Solution Agglomeration on the Deposition of Self-Assembled Monolayers, Langmuir 16 (20):7742-7751 (2000) (doi.org/10.1021/la000502q).

Dubey et al., Structure and Order of Phosphonic Acid-Based Self-Assembled Monolayers on Si(100), Langmuir 21 (26):14747-14754 (2010) (doi:10.1021/la1021438).

Kim et al., Self-Assembled Monolayers: Versatile Uses in Electronic Devices from Gate Dielectrics, Dopants, and Biosensing Linkers, Micromachines 12(5):565 (pp. 1-17) (2021) (doi.org/10.3390/mi12050565).

Noya et al., Planarization of Topography with Spin-On-Carbon Hard Mask, Proceedings of SPIE vol. 9779, 97791L-1 (pp. 1-6) (2016) (doi:10.1117/12.2218504).

Yu et al., Crosslinked organosulfur-based self-assembled monolayers: formation and applications, Soft Science 2:5 (pp. 1-27) (2022) (doi:10.20517/ss_2022.04).

Zheng et al., Novel planarization and passivation in the integration of III-V semiconductor devices Proceedings of SPIE vol. 5356 (pp. 81-91) (2004) (doi.org/10.1117/12.529696).

International Searching Authority, "Notification of Transmittal of the International Search Report and the Written Opinion of the International Searching Authority, or Declaration," Patent Cooperation Treaty, Dec. 26, 2024, 07 pages, International Application No. PCT/ IB2024/058258.

* cited by examiner

AREA SELECTIVE DEPOSITION OF HARDMASKS FOR VACUUM GAP FORMATION

TECHNICAL FIELD

The present invention relates generally to semiconductor fabrication and more specifically to a method for creating vacuum gaps in a thin film via area selective deposition of a hardmask material on a substrate.

BACKGROUND OF THE INVENTION

As the scaling of semiconductor devices continues to increase, the pitch requirements for metallization levels on the thin films used for the fabrication of dielectric materials must be reduced. In order to reduce the metallization of dielectric materials, the space between the metal signal lines on thin films must decrease. Decreasing the distance between metal signal lines has the associated problems of leading to an increase in the capacitance of the thin films and a consequent increase in electrical signal delays (i.e., resistance-capacitance (RC) time delays) and signal corruption due to cross-talk (i.e., the unwanted coupling of signals between adjacent wires or devices). In order to overcome these signal problems, the semiconductor industry has proposed the use of vacuum gaps between metal signal lines on dielectric materials. Vacuum gaps reduce the capacitance between metal lines by decreasing the dielectric constant of the material surrounding the metal signal lines. Vacuum gaps between metal lines are currently defined with photolithography where photoresists are used as a masking material for reactive ion etch into the thin films surrounding the metal signal lines. The use of photolithography for vacuum gap formation on thin films has the following disadvantages: (1) its application is limited by the wavelength of light used; (2) it can only be used on perfectly straight substrates; (3) it must be conducted in a clean room; and (4) it requires expensive equipment. In view of the foregoing, there is a need in the art for a more forgiving and affordable process for vacuum gap formation on dielectric materials.

SUMMARY OF THE INVENTION

The present invention overcomes the need in the art with a thin film fabrication method that produces a hardmask pattern with vacuum gaps adjacent to metal features on a dielectric substrate. The presence of the vacuum gaps on the dielectric substrate reduces high frequency signal corruption due to cross-talk and/or RC time delays and negates the need for a photolithography step to define a vacuum gap trench.

In one embodiment, the present invention relates to a method for forming a vacuum gap in a dielectric substrate comprising: depositing a self-assembled monolayer with reactive head groups onto a dielectric substrate with metal features, wherein the reactive head groups bind to the metal features; forming a hardmask on the dielectric substrate by area selective deposition of a hardmask material onto the dielectric substrate, wherein (i) due to the self-assembled monolayer bound to the metal features, the hardmask material reaches, but does not touch the metal features, (ii) the metal features and the hardmask material collectively form the hardmask, and (iii) the hardmask has gaps in areas located between the metal features and the selectively deposited hardmask material; etching the dielectric substrate, wherein the etching forms trenches in the gaps defined by the hardmask and undercuts the hardmask at the trench opening resulting in trenches with depths that are greater than the trench opening widths; and depositing a non-conformal coating onto the dielectric substrate, wherein the non-conformal coating closes the trench openings to create vacuum gaps in the trenches.

In another embodiment, the present invention relates to a method for forming a vacuum gap in a dielectric substrate comprising: depositing a self-assembled monolayer with a reactive head group that binds to copper onto a dielectric substrate with copper features; forming a hardmask on the dielectric substrate by area selective deposition of zinc oxide onto the dielectric substrate, wherein (i) due to the self-assembled monolayer bound to the copper features, the hardmask material reaches, but does not touch the copper features, (ii) the copper features and the zinc oxide collectively form the hardmask, and (iii) the hardmask has gaps in areas located between the copper features and the selectively deposited zinc oxide; reactive ion etching the dielectric substrate, wherein the etching forms trenches in the gaps defined by the hardmask and undercuts the hardmask at the trench opening resulting in trenches with depths that are greater than the trench opening widths; and depositing a non-conformal coating onto the dielectric substrate, wherein the fluorocarbon closes the trench openings to create vacuum gaps in the trenches.

In a further embodiment, the dielectric substrate comprises a material selected from the group consisting of ceramic, glass, and silicon.

In another embodiment, the self-assembled monolayer comprises a material selected from the group consisting of alcohols, amines, carboxylic acids, disulfides, phosphates, phosphonates, organophosphonates, silanes, thiols, and combinations thereof.

In a further embodiment, the hardmask material is selected from the group consisting of aluminum fluoride, aluminum oxide, lanthanum trifluoride, magnesium oxide, silicon dioxide, tantalum oxide, zinc oxide, and aluminum fluoride.

In another embodiment, the non-conformal coating comprises silica and/or silicon.

In a further embodiment, the non-conformal coating is tetraethyl orthosilicate and/or silicon dioxide.

In another embodiment, the hardmask material is selectively deposited onto the dielectric substrate via atomic layer deposition or chemical vapor deposition.

In a further embodiment, the self-assembled monolayer is removed from the metal features of the dielectric substrate following the selective deposition of the hardmask material.

In another embodiment, the self-assembled monolayer is removed from the metal features with hydrogen plasma.

In a further embodiment, the etching removes the self-assembled monolayer from the metal features of the dielectric substrate.

In another embodiment, the hardmask is etched via a technique selected from the group consisting of reactive ion etching, deep reactive ion etching, plasma etching, vapor phase etching, sputter etching, and ion-beam etching.

In a further embodiment, the hardmask is etched with fluorocarbon reactive ion etching.

In another embodiment, the dielectric substrate with the vacuum gaps is planarized to form a smooth surface on the dielectric substrate.

In a further embodiment, the metal features are configured on the dielectric substrate to form trenches in the hardmask that have a rectangular shape.

In another embodiment, the metal features are configured on the dielectric substrate to form trenches in the hardmask that have a trapezoidal shape.

Additional aspects and/or embodiments of the invention will be provided, without limitation, in the detailed description of the invention that is set forth below.

DETAILED DESCRIPTION OF THE INVENTION

Figures 1A, 1B, 1C, 1D:
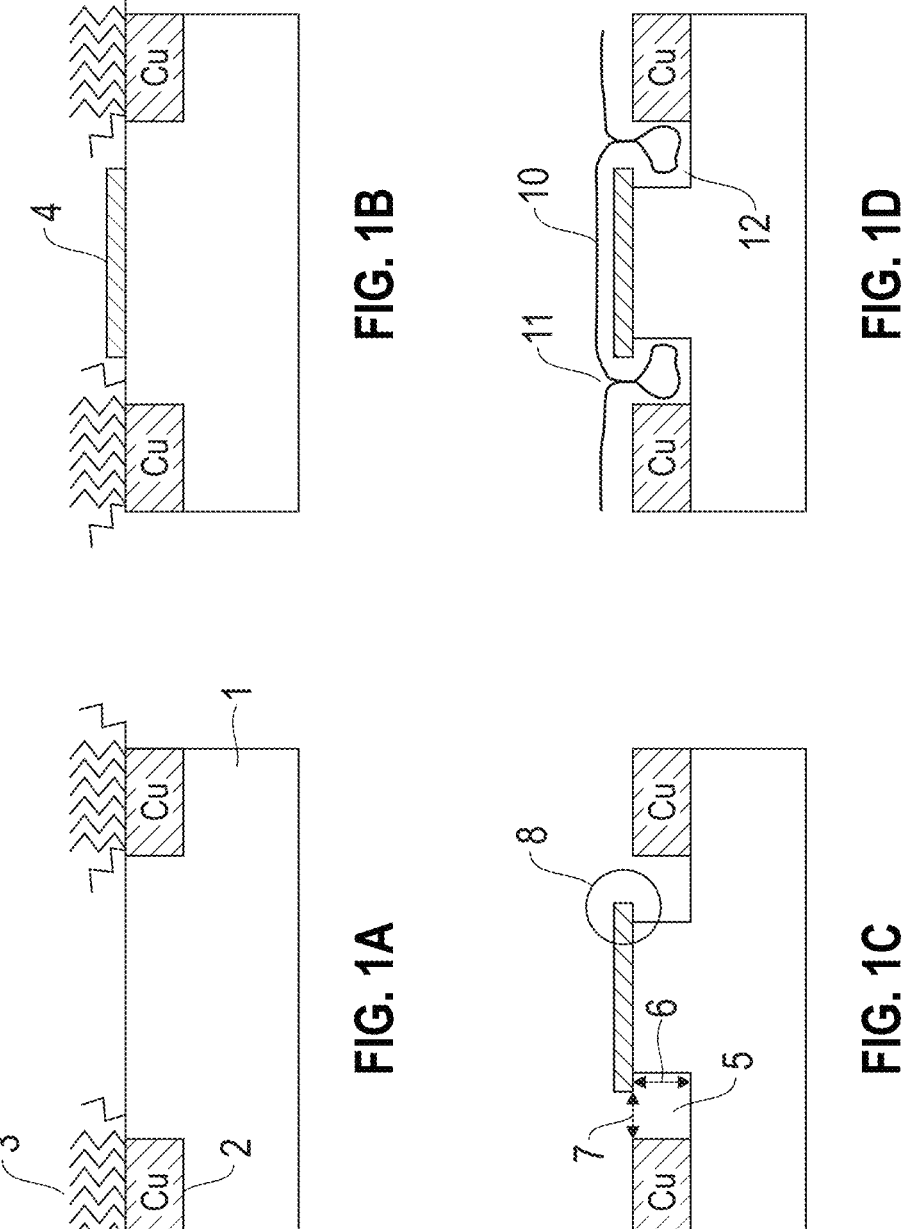
FIGS. 1A-1F are schematic diagrams of the steps leading to the formation of a dielectric film according to the vacuum gap formation method described herein.

Set forth below is a description of what are currently believed to be preferred aspects and/or embodiments of the claimed invention. Any alternates or modifications in function, purpose, or structure are intended to be covered by the appended claims. As used in this specification and the appended claims, the singular forms "a," "an," and "the" include plural referents unless the context clearly dictates otherwise. The terms "comprise," "comprised," "comprises," and/or "comprising," as used in the specification and appended claims, specify the presence of the expressly recited components, elements, features, and/or steps, but do not preclude the presence or addition of one or more other components, elements, features, and/or steps.

As used herein, the terms "thin film" and "film" refer to an electrical insulating layer that is used in the fabrication of dielectric materials. Thin films, which are deposited on a substrate, generally have a thickness in the order of 0.1 μm or smaller and include a metal.

As used herein, the term "substrate" and "dielectric substrate" are used interchangeably to refer to mechanical support materials for dielectric materials that have non-conductive (i.e., dielectric) and conductive (i.e., metal) thin films. Examples of dielectric substrates include ceramic, glass, and silicon wafers.

As used herein, the terms "self-assembled monolayer" and "SAM" refer to a one molecule thick layer of material that bonds to a substrate surface in an ordered way as a result of physical or chemical forces during a deposition process. SAMs assemble onto the substrate surface via adsorption from a solution. All SAMs have surface active head group that binds to the substrate, a hydrophobic body, and a terminal tail group that can be functionalized. Common head groups include, without limitation, alcohols, amines, carboxylic acids, disulfides, phosphates, phosphonates, organo-phosphonates, silanes, thiols, and combinations thereof. The choice of a SAM will typically depend upon the substrate to which the SAM will bond. For example, phosphonates and silanes may be applied to hydroxylated surfaces (e.g., silica, glass, alumina); silanes may be applied to oxide surfaces (e.g., iron oxide); organophosphonates, disulfides, and thiols may be applied to noble and/or coinage metals (e.g., gold, silver, copper); amines and alcohols may be applied to platinum surfaces; carboxylic acids may be applied to aluminum oxide surfaces; and phosphates may be applied to titanium or tantalum surfaces. It is to be understood that the foregoing list is illustrative and that different SAMs from those listed above may be modified to bond to different substances from those listed above. SAMs may be uncross-linked or crosslinked, with the latter having enhanced thermal and chemical stability over the former. As will be appreciated by one of skill in the art, any of the SAMS disclosed herein may be crosslinked by techniques known in the art (such as reaction with a crosslinking agent or exposure to UV light).

As used herein, the term "hardmask material" refers to a high-density material used in thin film fabrication that is deposited on a substrate in order to protect certain areas of the substrate from etching chemicals. Examples of hardmask materials, which may be deposited onto a dielectric substrate as described herein include, without limitation, aluminum fluoride ($AlF_3$), aluminum oxide ($Al_2O_3$), lanthanum trifluoride ($LaF_3$), magnesium oxide (MgO), silicon dioxide ($SiO_2$), tantalum oxide ($Ta_2O_5$), zinc oxide (ZnO), and combinations thereof.

As used herein, the term "hardmask" refers to a coating on a substrate that facilitates the etching of the substrate. Within the context of the present invention, a hardmask comprises the combination of the metal features incorporated into or onto a substrate and the hardmask material deposited onto the substrate.

As used herein, the term "area selective deposition" of "ASD" refers to a bottom-up process leading to a uniform deposition in selected areas of a patterned substrate. Within the context of the present invention, ASD techniques used to deposit the hardmask materials described herein include atomic layer deposition (ALD) and chemical vapor deposition (CVD). CVD is a method of ASD that uses a vacuum to produce thin films. With CVD, a substrate is exposed to one or more volatile precursors, which react and/or decompose on the substrate surface to deposit a material. With CVD, volatile by-products may be produced, which are typically removed by gas flow through a reaction chamber. ALD is a method of ASD that uses a gas-phase chemical process to produce thin films. ALD reactions use two precursor chemicals that react with the substrate surface one at a time in a sequential non-overlapping manner. In this way, a thin film is slowly deposited through repeated exposure to separate precursors. ALD is considered to be a subclass of CVD in that CVD is a continuous process in which all reactants are applied simultaneously to build the film whereas ALD is performed with sequential reactions. While ALD deposits films one atomic layer at a time, CVD can deposit films with a wider range of thickness.

As used herein, the terms "etch" and "etching" refer to a microfabrication method that chemically removes layers from the surface of a thin film. Examples of dry thin film etching techniques include, without limitation, reactive ion etching (RIE), deep reactive ion etching (DRIE), plasma etching, vapor phase etching, sputter etching, and ion-beam etching.

RIE is a dry etching process for thin films where a substrate is placed in a reaction in which several gases are introduced and a chemically reactive plasma is formed in the gas mixture with a radiofrequency (RF) power source that breaks the gas molecules into ions, the latter of which react at the surface of the material being etched knocking atoms out of the material without a chemical reaction. RIE has a maximum etch depth of around 10 μm at a rate of up to 1 μm/min. Examples of gases used with RIE include, without limitation, trifluoromethane ($CF_3$), tetrafluoromethane ($CF_4$), hexafluorobutadiene ($C_4F_6$), sulfur hexafluoride ($SF_6$), nitrogen trifluoride ($F_3N$), chlorine ($Cl_2$), fluorine ($F_2$), oxygen ($O_2$), and combinations thereof.

DRIE is a highly anisotropic RIE technique that uses a passivation layer and superimposed DC voltage to etch depths that exceed the depths for RIE. DRIE has an etch depth of up to 600 μm at rates of up to 20 μm/min. Examples of etching materials for DRIE include, without limitation, tetrafluoromethane ($CF_4$), carbon tetrachloride ($CCl_4$), boron trichloride ($BCl_3$), sulfur hexafluoride (SF6)+octafluorocyclobutane (C4F8), sulfur hexafluoride (SF6)+oxygen (O2) at cryogenic temperatures, and combinations thereof.

With plasma etching, the substrate in the reactor is subjected to a high-speed stream of plasma (which is created by exciting ions in a gas) to remove material from the substrate. Examples of gases used in plasma etching include tetrafluoromethane ($CF_4$) and oxygen ($O_2$), which may be used alone or in combination.

With vapor phase etching, the substrate in the reactor is dissolved at the surface by a combination of a chemical reaction and exposure to one or more gases. Examples of vapor phase etching materials include hydrogen fluoride (HF) and xenon difluoride ($XeF_2$), which may be used alone or in combination.

Sputter etching is RIE etching without reactive ions. With sputter etching, the substrate in the reactor is subjected to ion bombardment instead of the target material. Etching materials used for sputter etching include, without limitation, the noble inert gases of helium (He), neon (Ne), argon (Ar), krypton (Kr), and xenon (Xe), which may be used alone or in combination.

With ion-beam etching, the substrate in the reactor is subjected to a beam of ions to remove material from the substrate surface. Etching materials used for ion-beam etching include, without limitation, the noble inert gases of helium (He), neon (Ne), argon (Ar), krypton (Kr), and xenon (Xe), which may be used alone or in combinations.

As used herein, the terms "non-conformal" and "non-conformal coating" refer to a film that does not deposit on all exposed surfaces at the same deposition rate. For example, a film deposited on an exposed horizontal surface may be thicker than a film deposited on a vertically oriented surface. Further, different films may inherently be non-conformal or may be tuned to be non-conformal. For example, a thin film that is evaporated will be non-conformal while sputter deposition may be tuned to be non-conformal. Depending on the material and deposition parameters, a non-conformal coating may be applied to a dielectric substrate via ALD, CVD, or physical vapor deposition (PVD). Examples of materials that be used to form non-conformal coatings include silica and/or silicon. Two non-limiting examples of non-conformal coating materials are tetraethyl orthosilicate (TEOS) and silicon dioxide ($SiO_2$).

As used herein, the term "physical vapor deposition" or "PVD" refers to a vacuum deposition method that can produce thin films and coatings on substrates. With PVD, the material forming the thin film or coating transitions from a condensed phase to a vapor phase and then back to a thin film condensed phase. Examples of PVD techniques include sputtering and thermal or electron beam evaporation.

As used herein, the terms "planarization," "planarizing," and "planarized" refer to a flattening or smoothing of the surface of a thin film by filling in trench areas and/or filling in via holes. Examples of planarization techniques include, without limitation, oxidation, chemical-mechanical polishing, chemical etching, sacrificial etch-back, resputtering of deposited films to smooth them out, deposition of spin-on glass followed by reflow process or bake, deposition of organic planarizing layers, and combinations thereof.

Described herein is a method for forming a patterned thin film that includes vacuum gaps, which is shown schematically in FIGS. 1A-1F.

With reference to FIG. 1A, the first step in the process comprises application of a self-assembled monolayer (SAM) 3 to a substrate 1 suitable for thin film fabrication that has metal features 2. The SAM is typically adhered to the substrate via immersion of the substrate in a solution comprising the SAM in a solvent at which time the reactive head groups of the SAM bind to the metal lines leaving the central and terminal parts of the SAM unbound. While FIG. 1A shows that the metal features are made of copper, it is to be understood that the metal features on the substrate surface may be any suitable metal for a thin film. While the metal features will typically be metal lines (as shown in FIG. 1A), other metal micro or nanostructures, such as vias, may also be used to form a pattern on a thin film. As shown in FIG. 1A, the SAM 3 binds to the metal features 2 to form a chemical pre-pattern on the substrate surface. The application of the SAM on and adjacent to the metal features forms an inhibition layer on the substrate surface.

With reference to FIG. 1B, a hardmask material 4 is applied to the pre-patterned substrate surface via ASD to form a film that only grows on the areas of the substrate that do not include the SAM inhibition layer. Due to the presence of the SAM on the metal features, the hardmask material forms layers of film on the substrate surface that are adjacent to, but do not reach the metal features. The combination of the SAM on the metal features and the hardmask material form the pattern for the thin film.

With reference to FIGS. 1C, the SAM is removed from the substrate surface either with hydrogen ($H_2$) plasma (described in Example 1) or as part of the etching process (described in Example 2). Where fluorocarbon RIE is used for etching, the SAM will not survive the process and thus, a separate SAM removal step is not necessary. Upon removal of the SAM (either through the etching process or as a separate step) the areas adjacent to the metal features, which do not include the film formed from the hardmask material, are exposed as uncoated trench areas 5. In order for vacuum gaps to form, the trench depth 6 must be greater than the width of the trench opening 7 at the substrate surface. As a result of the deposition of the SAM in the areas adjacent to the metal features 4, upon removal of the SAM (either with or without etching), the formation of the trench 5 results in the hardmask to be undercut 8 thus forming an overhang 9 of hardmask at the location of the trench, which causes a reduction in the width of the trench opening 7 at the substrate surface in comparison to the depth 6 of the trench.

With reference to FIG. 1D, for the etching of the patterned hardmask, any etching technique described herein or known in the art may be used. FIG. 1D schematically shows application of a blanketing technique with an etching material, such as fluorocarbon RIE, onto the patterned substrate surface 10. Upon deposition, the etching material blankets the metal features, the area of the substrate coated with the hardmask material, and the trenches. Because the depth of the trenches 6 are greater than the width of the trenches at the substrate surface 7, the etching material meets at the top of the trench 11 (i.e., at the trench opening) before the trench is filled with the etching material thus forming a keyhole pattern within the trench where the unfilled portion of the trench 12 forms a void or vacuum gap.

7

8

Figure 1E:
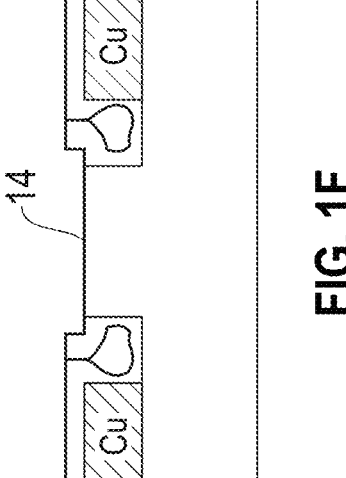

With reference to FIG. 1E, once the thin film has been etched, the film may be planarized to smooth the surface of the film 13 by using one or more of the planarization methods described herein.

Figure 1F:
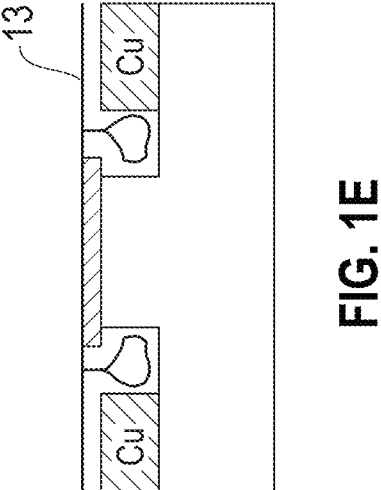

With reference to FIG. 1F, a final chemical and/or mechanical polish or a photolithography step may be applied to the planarized thin film surface to remove any excess hardmask or etching materials 14 remaining on the thin film.

The method described herein is a self-aligned process in that the selective SAM deposition step defines the location of the vacuum gap(s) in the resultant patterned thin film. Patterned thin films that include vacuum gaps as described herein reduce high frequency signal corruption due to cross-talk and/or RC time delays and negate the need for a photolithography step to define a vacuum gap trench.

Figure 2A:
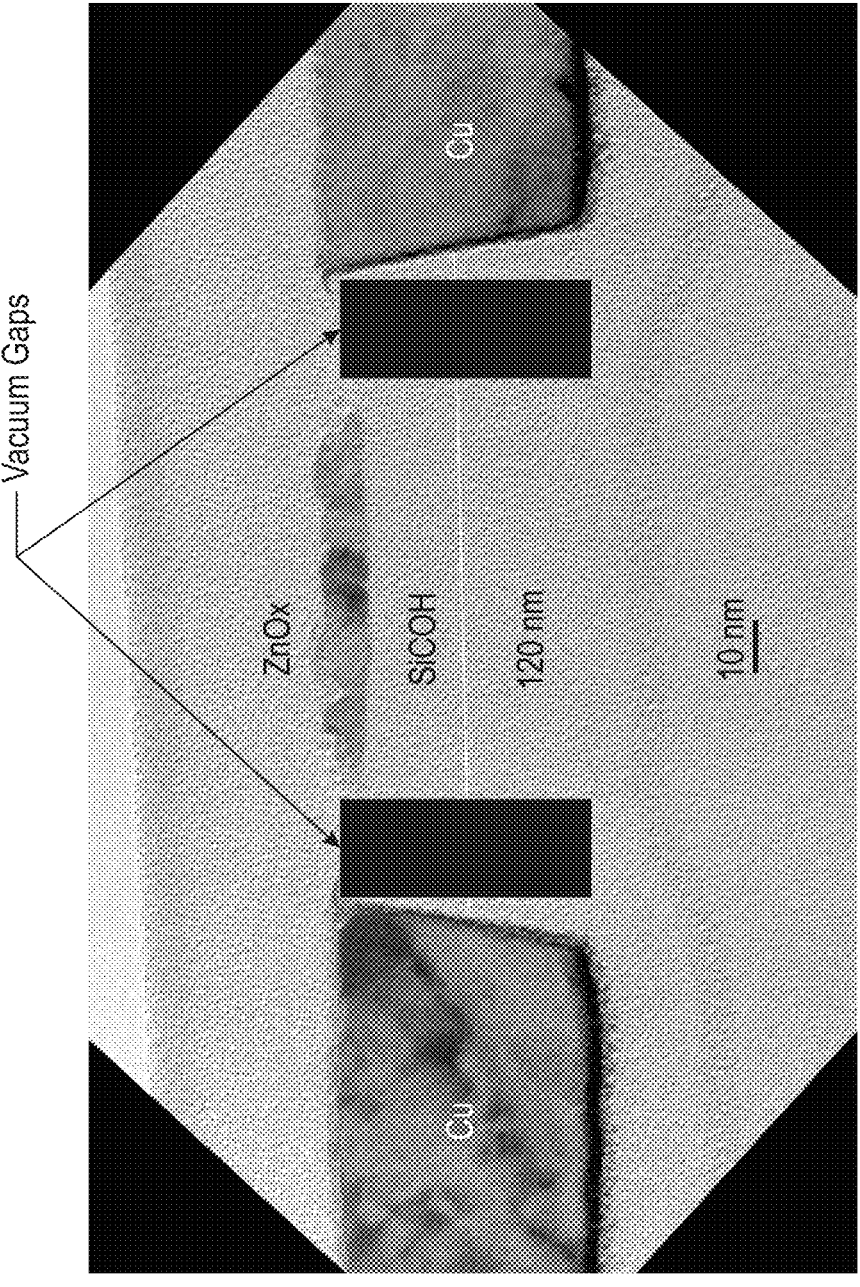
FIGS. 2A-2C are bright field transmission electron microscope images of an organosilicate dielectric substrate with a copper feature and a zinc oxide hardmask where the positions of the vacuum gaps are shown with rectangles (FIGS. 2A and 2B) or trapezoids (FIG. 2C).
Figure 2B:
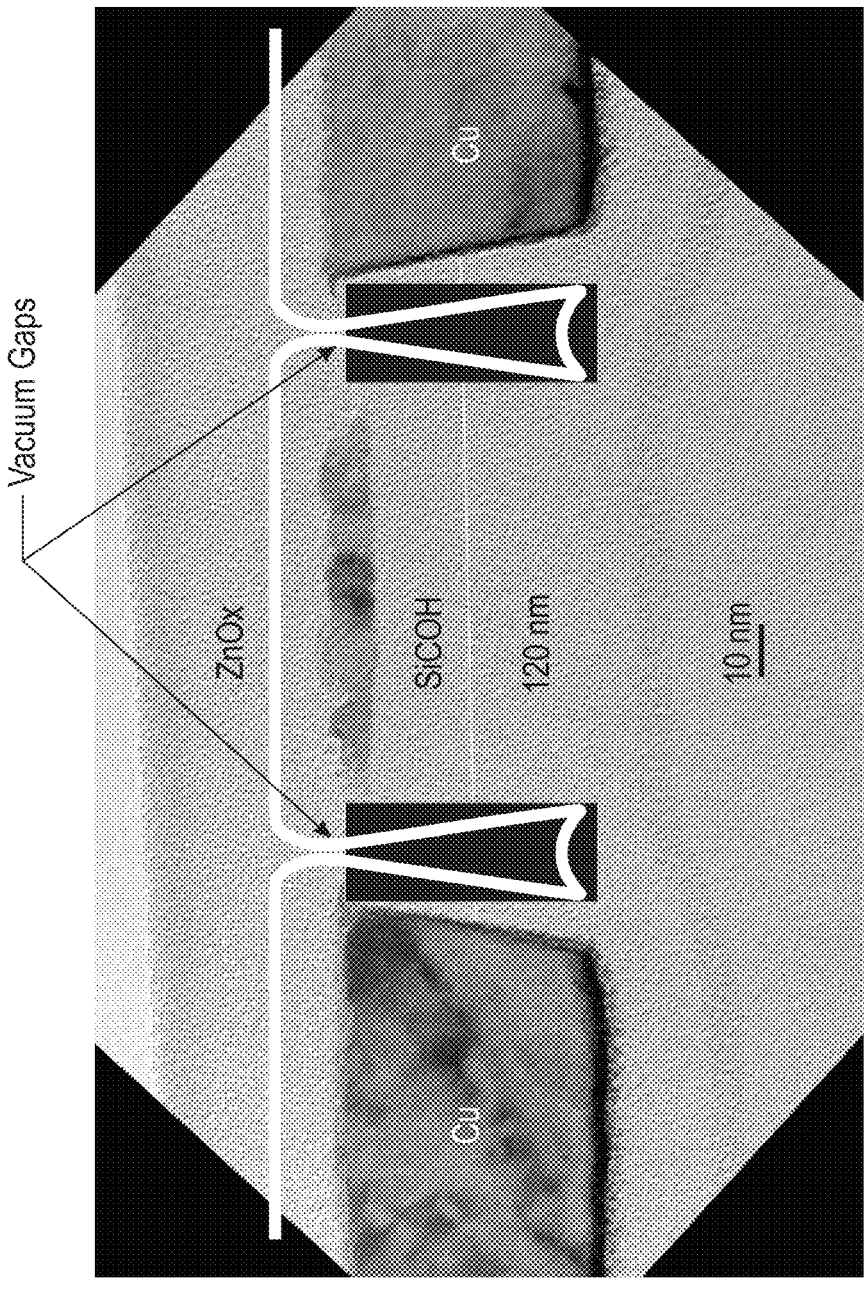
Figure 2C:
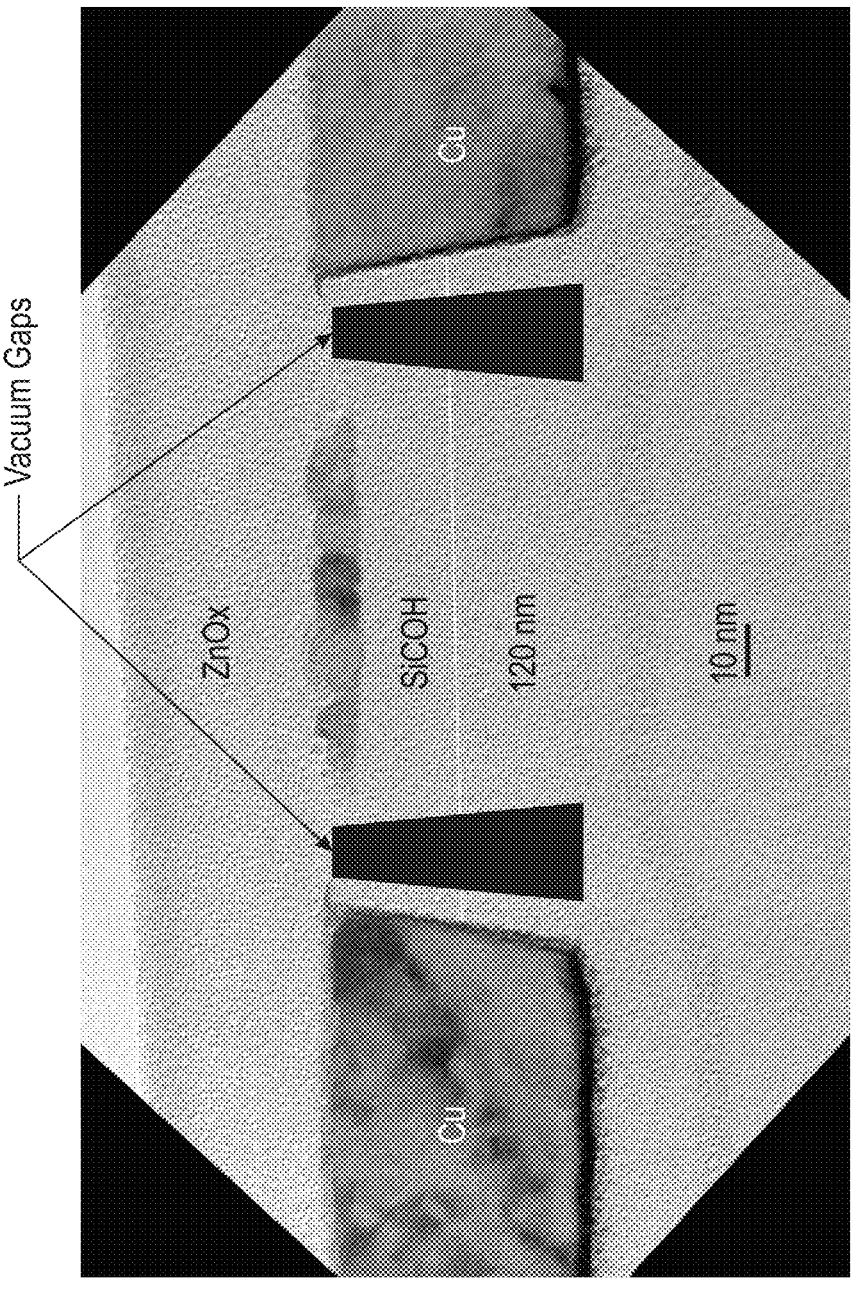

FIG. 2A is a bright field transmission electron microscope (TEM-BF) image of an organosilicate glass (SiCOH) dielectric substrate with copper lines and a ZnO ALD hardmask that shows the location of the vacuum gaps. Due to the SiCOH etch selectivity to Cu and ZnO, the hardmask is self-aligned to the edges of the metal lines, thus forming the vacuum gaps; consequently, a photolithography step is not required to etch the substrate. While the gaps in the substrate are shown schematically as rectangles with a trench depth greater than the trench opening width, it is to be understood that the gap can be another shape, such as a trapezoid (FIG. 2C); the only requirement of the shape is the width of the opening of the trench is smaller than the depth of the trench. FIG. 2B shows how a dielectric film blankets an etched surface on a substrate and fills in the vacuum gap trenches to form a keyhole formation. Because the vacuum gap has a depth that is greater than the width of the opening of the trench at the substrate surface, the dielectric film falls into the trench and forms a keyhole formation within the trench where the keyhole formation results in the dielectric film forming a closure at the opening of the trench at the substrate surface.

In one embodiment, the method of forming vacuum gaps in a thin film comprises depositing a self-assembled mono-layer (SAM) onto a substrate comprising metal features, wherein the self-assembled monolayer has a reactive head group that binds to the metal features; selectively depositing a hardmask material on the substrate via ASD (ALD or CVD), wherein (i) the hardmask material binds to areas of the substrate that are not bound to the SAM, (ii) the metal features and the hardmask material collectively form a hardmask on the substrate, and (iii) the hardmask has gaps in the areas of the substrate that do not have the metal features or the hardmask material; removing the SAM via hydrogen plasma; etching the substrate, wherein the etching forms trenches in the location of the gaps, wherein the trenches have a depth that is greater than the width of the trench opening at the substrate surface; and depositing a non-conformal coating that blankets the hardmask on the substrate surface, including the trenches, wherein vacuum gaps are formed by the non-conformal coating closing off entry at the trench openings prior to the complete filling of the trenches with the non-conformal coating.

In another embodiment, the method of forming vacuum gaps in a thin film comprises depositing a self-assembled monolayer (SAM) onto a substrate comprising metal features, wherein the self-assembled monolayer has a reactive head group that binds to the metal features; selectively depositing a hardmask material on the substrate via ASD (ALD or CVD), wherein (i) the hardmask material binds to areas of the substrate that are not bound to the SAM, (ii) the metal features and the hardmask material collectively form a hardmask on the substrate, and (iii) the hardmask has gaps in the areas of the substrate that do not have the metal features or the hardmask material; etching the substrate, wherein the etching simultaneously removes the SAM and forms trenches in the location of the gaps, wherein the trenches have a depth that is greater than the width of the trench opening at the substrate surface; and depositing a non-conformal coating that blankets the hardmask on the substrate surface, including the trenches, wherein vacuum gaps are formed by the non-conformal coating closing off entry at the trench openings prior to the complete filling of the trenches with the non-conformal coating.

In a further embodiment, the substrate is a dielectric substrate comprised of a material selected from the group consisting of ceramic, glass, and silicon.

In another embodiment, the dielectric substrate is a silicon wafer.

In a further embodiment, the metal features comprise a metal selected from the group consisting of aluminum, chromium, copper, germanium, gold, nickel, platinum, silver, tantalum, titanium, tungsten, and combinations thereof.

In another embodiment, the metal features are configured on the dielectric substrate to form trenches that have a rectangular shape.

In a further embodiment, the metal features are configured on the dielectric substrate to form trenches that have a trapezoidal shape.

In another embodiment, the SAM comprises a material selected from the group consisting of alcohols, amines, carboxylic acids, disulfides, phosphates, phosphonates, organophosphonates, silanes, and thiols.

In a further embodiment, the substrate has copper features and the SAM has a reactive binding head that binds to copper, the latter of which is selected from the group consisting of organophosphonates, disulfides, and thiols.

In another embodiment, the substrate is an organosilicate glass and the SAM is an organophosphonate.

In a further embodiment, the hardmask material is selected from the group consisting of aluminum fluoride (AlF$_3$), aluminum oxide (Al$_2$O$_3$), lanthanum trifluoride (LaF$_3$), magnesium oxide (MgO), silicon dioxide (SiO$_2$), tantalum oxide (Ta$_2$O$_5$), and zinc oxide (ZnO).

In order for the method described herein to be most effective, the substrate material, metal features, and hardmask material should be chosen so that the substrate material is selective for the metal features and the hardmask material. For example, an organosilicate substrate has etch selectivity to copper metal and ZnO (Examples 1 and 2).

In another embodiment, the hardmask is etched via a technique selected from the group consisting of reactive ion etching, deep reactive ion etching, plasma etching, vapor phase etching, sputter etching, and ion-beam etching.

In a further embodiment, the hardmask is etched via a technique selected from the group consisting of reactive ion etching (RIE), deep reactive ion etching (DRIE), plasma etching, vapor phase etching, sputter etching, and ion-beam etching.

In another embodiment, the etching is fluorocarbon RIE etching, wherein the fluorocarbon is selected from the group consisting of trifluoromethane, tetrafluoromethane, hexafluorobutadiene, and combinations thereof.

In a further embodiment, the non-conformal coating comprises silica and/or silicon In another embodiment, the non-conformal coating is tetraethyl orthosilicate (TEOS) and/or silicon dioxide (SiO$_2$).

In a further embodiment, the substrate with the non-conformal coating is planarized to smooth the substrate surface.

In another embodiment, the planarization comprises a method selected from the group consisting of oxidation, chemical-mechanical polishing, chemical etching, sacrificial etch-back, resputtering of deposited films, and deposition of spin-on glass.

The descriptions of the various aspects and/or embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the aspects and/or embodiments, the practical application or technical improvement over technologies found in the marketplace, or to enable others of ordinary skill in the art to understand the aspects and/or embodiments disclosed herein.

EXPERIMENTAL

The following examples are set forth to provide those of ordinary skill in the art with a complete disclosure of how to make and use the aspects and embodiments of the invention as set forth herein. While efforts have been made to ensure accuracy with respect to variables, experimental error and deviations should be considered. Unless indicated otherwise, parts are parts by weight, temperature is degrees centigrade, and pressure is at or near atmospheric. All components were obtained commercially unless otherwise indicated.

Example 1

Forming a Vacuum Gap on a Patterned Organosilicate Glass Dielectric Substrate An organosilicate glass (SiCOH) dielectric substrate (SiCOH/dielectric) with patterned copper lines was immersed into a solution of an organophosphonic acid (N-phosphonomethyl-butyramide) SAM (SAM XL) in 4-methyl 2-pentanol 0.1 wt. % for 30 minutes (but not longer than 30 minutes in order to avoid potential agglomeration of coupling agents in the SAM XL/solvent) during which time the head group of the SAM XL selectively bound to the copper lines on the substrate surface. The substrate surface was then rinsed with 4-ethyl-2-pentanol and then the substrate was placed under $N_2$ for the monolayer to dry. In a dry $N_2$ environment, the dried monolayer on the substrate surface was stable for weeks.

The patterned substrate was treated with zinc oxide (ZnO) via ALD resulting in a hardmask on the surface of the SiCOH/dielectric. Upon deposition, the ZnO did not bind to the SAM XL coated copper lines and also left uncoated regions adjacent to the copper lines, i.e., vacuum gaps that have widths that are much smaller than the depths of the trenches formed by the copper lines. The SAM XL was removed from the SiCOH/dielectric surface with $H_2$ plasma.

Example 2

Forming a Keyhole Struction on an Etched Dielectric Film

On a hardmask prepared according to the procedure described in Example 1, the SAM XL is not removed from the SiCOH/dielectric with $H_2$; instead, the SAM XL is removed during the etch of the hardmask. Application of RIE to deposit a fluorocarbon, such as $CF_4$ onto the sidewalls of the SiCOH/dielectric removes the bound SAM XL leaving trenches in the substrate in the areas that are adjacent to the copper lines as well as undercuts in the substrate at the substrate openings (FIG. 1C). Subsequent deposition of a non-conformal coating, such as TEOS or $SiO_2$, applied via CVD or PVD forms vacuum gaps in the trenches where the non-conformal coating closes off at the top of the trenches prior to the complete filling of the trenches (FIG. 1).

We claim:

1. A method for forming a vacuum gap in a dielectric substrate comprising:
   depositing a self-assembled monolayer with reactive head groups onto a dielectric substrate with metal features, wherein the reactive head groups bind to the metal features;
   forming a hardmask on the dielectric substrate by area selective deposition of a hardmask material onto the dielectric substrate, wherein (i) due to the self-assembled monolayer bound to the metal features, the hardmask material reaches, but does not touch the metal features, (ii) the metal features and the hardmask material collectively form the hardmask, and (iii) the hardmask has gaps in areas located between the metal features and the selectively deposited hardmask material;
   etching the dielectric substrate, wherein the etching forms trenches in the gaps defined by the hardmask and undercuts the hardmask at the trench opening resulting in trenches with depths that are greater than the trench opening widths; and
   depositing a non-conformal coating onto the dielectric substrate, wherein the non-conformal coating closes the trench openings to create vacuum gaps in the trenches.

2. The method of claim 1, wherein the hardmask material is selectively deposited onto the dielectric substrate via atomic layer deposition or chemical vapor deposition.

3. The method of claim 1, wherein the self-assembled monolayer is removed from the metal features of the dielectric substrate with hydrogen plasma treatment following the selective deposition of the hardmask material.

4. The method of claim 1, wherein the etching removes the self-assembled monolayer from the metal features of the dielectric substrate.

5. The method of claim 1, wherein the hardmask is etched via a technique selected from the group consisting of reactive ion etching, deep reactive ion etching, plasma etching, vapor phase etching, sputter etching, and ion-beam etching.

6. The method of claim 1, wherein the dielectric substrate comprises a material selected from the group consisting of ceramic, glass, and silicon.

7. The method of claim 1, wherein the self-assembled monolayer comprises a material selected from the group consisting of alcohols, amines, carboxylic acids, disulfides, phosphates, phosphonates, organophosphonates, silanes, thiols, and combinations thereof.

8. The method of claim 1, wherein the hardmask material is selected from the group consisting of aluminum fluoride, aluminum oxide, lanthanum trifluoride, magnesium oxide, silicon dioxide, tantalum oxide, zinc oxide, and combinations thereof.

9. The method of claim 1, wherein the non-conformal coating comprises silica and/or silicon.

10. A method for forming a vacuum gap in a dielectric substrate comprising:

depositing a self-assembled monolayer with a reactive head group that binds to copper onto a dielectric substrate with copper features;

forming a hardmask on the dielectric substrate by area selective deposition of zinc oxide onto the dielectric substrate, wherein (i) due to the self-assembled monolayer bound to the copper features, the hardmask material reaches, but does not touch the copper features, (ii) the copper features and the zinc oxide collectively form the hardmask, and (iii) the hardmask has gaps in areas located between the copper features and the selectively deposited zinc oxide;

etching the dielectric substrate, wherein the etching forms trenches in the gaps defined by the hardmask and undercuts the hardmask at the trench opening resulting in trenches with depths that are greater than the trench opening widths; and depositing a non-conformal coating onto the dielectric substrate, wherein the non-conformal coating closes the trench openings to create vacuum gaps in the trenches.

11. The method of claim 10, wherein the reactive head group of the self-assembled monolayer is selected from the group consisting of organophosphonates, disulfides, thiols, and combinations thereof.

12. The method of claim 10, wherein the zinc oxide is selectively deposited onto the dielectric substrate via atomic layer deposition or chemical vapor deposition.

13. The method of claim 10, wherein the self-assembled monolayer is removed from the copper features of the dielectric substrate with hydrogen plasma treatment following the selective deposition of the zinc oxide.

14. The method of claim 10, wherein the etching removes the self-assembled monolayer from the copper features of the dielectric substrate.

15. The method of claim 10, wherein the hardmask is etched via a technique selected from the group consisting of reactive ion etching, deep reactive ion etching, plasma etching, vapor phase etching, sputter etching, and ion-beam etching.

16. The method of claim 10, wherein the dielectric substrate comprises a material selected from the group consisting of ceramic, glass, and silicon.

17. The method of claim 10, wherein the non-conformal coating is tetraethyl orthosilicate and/or silicon dioxide.

18. A method for forming a vacuum gap in a dielectric substrate comprising:

depositing a self-assembled monolayer with reactive head groups onto a dielectric substrate with metal features, wherein the reactive head groups bind to the metal features;

forming a hardmask on the dielectric substrate by area selective deposition of a hardmask material onto the dielectric substrate, wherein (i) due to the self-assembled monolayer bound to the metal features, the hardmask material reaches, but does not touch the metal features, (ii) the metal features and the hardmask material collectively form the hardmask, and (iii) the hardmask has gaps in areas located between the metal features and the selectively deposited hardmask material;

removing the self-assembled monolayer from the dielectric substrate;

etching the dielectric substrate, wherein the etching forms trenches in the gaps defined by the hardmask and undercuts the hardmask at the trench opening resulting in trenches with depths that are greater than the trench opening widths;

depositing a non-conformal coating onto the dielectric substrate, wherein the non-conformal coating closes the trench openings to create vacuum gaps in the trenches; and planarizing the dielectric substrate to form a smooth surface on the dielectric substrate.

19. The method of claim 18, wherein the self-assembled monolayer is removed from the dielectric substrate with hydrogen plasma treatment.

20. The method of claim 18, wherein the metal features are configured on the dielectric substrate to form trenches in the hardmask that have a rectangular shape.

21. The method of claim 18, wherein the metal features are configured on the dielectric substrate to form trenches in the hardmask that have a trapezoidal shape.

22. A method for forming a vacuum gap in a dielectric substrate comprising:

depositing a self-assembled monolayer with reactive head groups onto a dielectric substrate with metal features, wherein the reactive head groups bind to the metal features;

forming a hardmask on the dielectric substrate by area selective deposition of a hardmask material onto the dielectric substrate, wherein (i) due to the self-assembled monolayer bound to the metal features, the hardmask material reaches, but does not touch the metal features, (ii) the metal features and the hardmask material collectively form the hardmask, and (iii) the hardmask has gaps in areas located between the metal features and the selectively deposited hardmask material;

etching the dielectric substrate, wherein the etching forms trenches in the gaps defined by the hardmask and undercuts the hardmask at the trench opening resulting in trenches with depths that are greater than the trench opening widths, and further wherein the etching removes the self-assembled monolayer from the dielectric substrate;

depositing a non-conformal coating onto the dielectric substrate, wherein the non-conformal coating closes the trench openings to create vacuum gaps in the trenches; and planarizing the dielectric substrate to form a smooth surface on the dielectric substrate.

23. The method of claim 22, wherein the metal features are configured on the dielectric substrate to form trenches in the hardmask that have a rectangular shape.

24. The method of claim 22, wherein the metal features are configured on the dielectric substrate to form trenches in the hardmask that have a trapezoidal shape.

25. The method of claim 22, wherein the hardmask is etched with reactive ion etching.

* * * * *